United States Patent [19]

Tang

[11] Patent Number: 5,276,380
[45] Date of Patent: Jan. 4, 1994

[54] ORGANIC ELECTROLUMINESCENT IMAGE DISPLAY DEVICE

[75] Inventor: Ching W. Tang, Rochester, N.Y.

[73] Assignee: Eastman Kodak Company, Rochester, N.Y.

[21] Appl. No.: 814,512

[22] Filed: Dec. 30, 1991

[51] Int. Cl.$^5$ ............................................ H05B 33/02
[52] U.S. Cl. ................................. 313/504; 313/500; 313/505; 345/76
[58] Field of Search .............. 313/500, 503, 504, 505, 313/485, 496, 494, 509; 428/917, 690; 340/781

[56] References Cited

U.S. PATENT DOCUMENTS

| | | | |
|---|---|---|---|
| 4,446,399 | 5/1984 | Endo et al. | 313/505 |
| 4,999,539 | 3/1991 | Coovert et al. | 313/505 |

FOREIGN PATENT DOCUMENTS 349265  1/1990  European Pat. Off. ...... H05B 33/26

*Primary Examiner*—Donald J. Yusko
*Assistant Examiner*—Ashok Patel
*Attorney, Agent, or Firm*—Raymond L. Owens

[57] ABSTRACT

An improvement in a light emitting device having an image display array consisting of a plurality of light emitting pixels arranged in intersecting columns and rows. The pixels are each located on a common electrically insulative light transmissive support with pixels in the same column including a common light transmissive first electrode element located on the support. An organic electroluminescent medium overlies the first electrode elements. The pixels of each row include a common second electrode element located on the organic electroluminescent medium. The light emitting device is fabricated by providing the support with the first electrode elements positioned in laterally spaced columns thereon to form a supporting surface, depositing the organic electroluminescent medium on the supporting surface, and forming the second electrode elements on the surface of the organic electroluminescent medium.

7 Claims, 2 Drawing Sheets

ORGANIC ELECTROLUMINESCENT IMAGE DISPLAY DEVICE

FIELD OF THE INVENTION

The invention is directed to an organic electroluminescent image display device and to a process for its fabrication.

RELATED PATENT APPLICATION

Tang et al U.S. Ser. No. 814,163, filed concurrently herewith and commonly assigned, titled ORGANIC ELECTROLUMINESCENT MULTICOLOR IMAGE DISPLAY DEVICE AND PROCESS FOR ITS FABRICATION, discloses a multcolor image display device and a process for its preparation in which walls are employed to create a pattern of sub-pixel areas and to create a pattern of overlying electrodes.

PRIOR ART

Scozzafava EP 349,265 (a patent application published by the European Patent Office on Jan. 3, 1990) discloses an organic electroluminescent image display device and a process for its fabrication.

Scozzafava discloses a glass support bearing a series of laterally spaced, parallel indium tin oxide anode strips. An organic electroluminescent medium overlies the anode strips. Laterally spaced, parallel cathode strips, orthogonally oriented relative to the anode strips, are formed over the organic electroluminescent medium by depositing cathode forming metal as a continuous layer followed by patterning. Patterning of the cathode layer into cathode strips is achieved by spin coating a solution of monomeric negative-working photoresist in 2-ethoxyethanol solvent. The photoresist is imagewise exposed to UV radiation to produce a pattern of crosslinking, and uncrosslinked photoresist is removed by dipping the array in 2-ethoxyethanol for a few seconds. This removes unexposed photoresist and uncovers areas of the cathode layer. The uncovered areas of the cathode layer are removed by dipping the array in an acid etch bath consisting of 1000:1 water:sulfuric acid solution. After producing the cathode strips by this procedure, the array is rinsed in water and spun to remove excess water.

PROBLEM TO BE SOLVED

Organic electroluminescent devices that emit light in response to an applied voltage and cease to emit light when the applied voltage is removed constructed with an anode and cathode that are each unitary elements can be turned on and turned off, but lack an image display capability when used alone. When an organic electroluminescent device is given an image display capability by patterning each of the anode and cathode into parallel strips that are relatively orthogonally oriented, the problem arises that the electrode element that overlies the organic electroluminescent medium must be patterned after it is deposited. When this is undertaken by conventional wet chemistry patterning techniques, specifically illustrated by Scozzafava, either or both the performance and useful operating life of the imaging display is degraded as compared to a similar organic electroluminescent device having a unitary cathode and anode. Both organic electroluminescent medium and cathode degradation has been observed.

SUMMARY OF THE INVENTION

In one aspect the invention is directed to a light emitting device comprised of an image display array consisting of a plurality of light emitting pixels arranged in intersecting columns and rows. The pixels are each located on a common electrically insulative light transmissive support, and the pixels in each column contain and are joined by a common light transmissive first electrode element located on the support. The first electrode elements in adjacent columns are laterally spaced on the support. An organic electroluminescent medium is located on a supporting surface formed by the support and the first electrode elements. The pixels of each row contain and are joined by a common second electrode element located on the organic electroluminescent medium, and the second electrode elements in adjacent rows are laterally spaced on the organic electroluminescent medium.

The light emitting device is characterized in that walls of a height exceeding the thickness of the organic electroluminescent medium are positioned along common boundaries of the pixels in adjacent rows. The walls are interposed between the organic electroluminescent medium and the supporting surface, and the second electrode element in each row overlies the organic electroluminescent medium and in rows separating two adjacent rows extends from one wall at one of the boundaries to a location laterally spaced from a second wall at another of the boundaries.

In another aspect, the invention is directed to a process of preparing a light emitting device comprised of an image display array consisting of a plurality of light emitting pixels arranged in intersecting columns and rows, the pixels each being located on a common electrically insulative light transmissive support, the pixels in each column containing and being joined by a common light transmissive first electrode element located on the support, the first electrode elements in adjacent columns being laterally spaced on the support, an organic electroluminescent medium located on a supporting surface formed by the support and the first electrode elements, the pixels of each row containing and being joined by a common second electrode element located on the organic electroluminescent medium, and the second electrode elements in adjacent rows being laterally spaced on the organic electroluminescent medium, comprising (a) providing the support with the first electrode elements positioned in laterally spaced columns thereon to form the supporting surface, (b) depositing the organic electroluminescent medium on the supporting surface, and (c) forming the second electrode elements on the surface of the organic electroluminescent medium.

The process is characterized in that a series of walls of a height exceeding the thickness of the organic electroluminescent medium are formed at common boundaries of the pixels in adjacent rows prior to depositing the organic electroluminescent medium. A source for the vapor phase deposition of metal forming the second electrode elements is oriented relative to the supporting surface at an angle that interposes each wall between the source and an adjacent portion of the surface of the organic electroluminescent medium, and the metal forming the second electrode elements is selectively deposited on the surface of the organic electroluminescent medium in areas other than those in which the walls are interposed between the source and the surface of the electroluminescent medium.

An advantage of the invention is that the organic electroluminescent devices of the invention having an image display capability can exhibit operating characteristics comparable to those of otherwise similar organic electroluminescent devices lacking an image display capability.

The processes of the invention by which the image display organic electroluminescent devices are fabricated offer the advantage that the electrodes overlying the electroluminescent medium can be initially deposited in their desired pattern. Hence removal of metal to form the desired overlying electrode pattern and the disadvantages attendant such procedures are entirely eliminated.

Since device feature dimensions such as layer thicknesses are frequently in sub-micrometer ranges, the drawings are scaled for ease of visualization rather than dimensional accuracy.

DESCRIPTION OF PREFERRED EMBODIMENTS

The acronym EL is in some instances employed for the term "electroluminescent".

Figure 1:
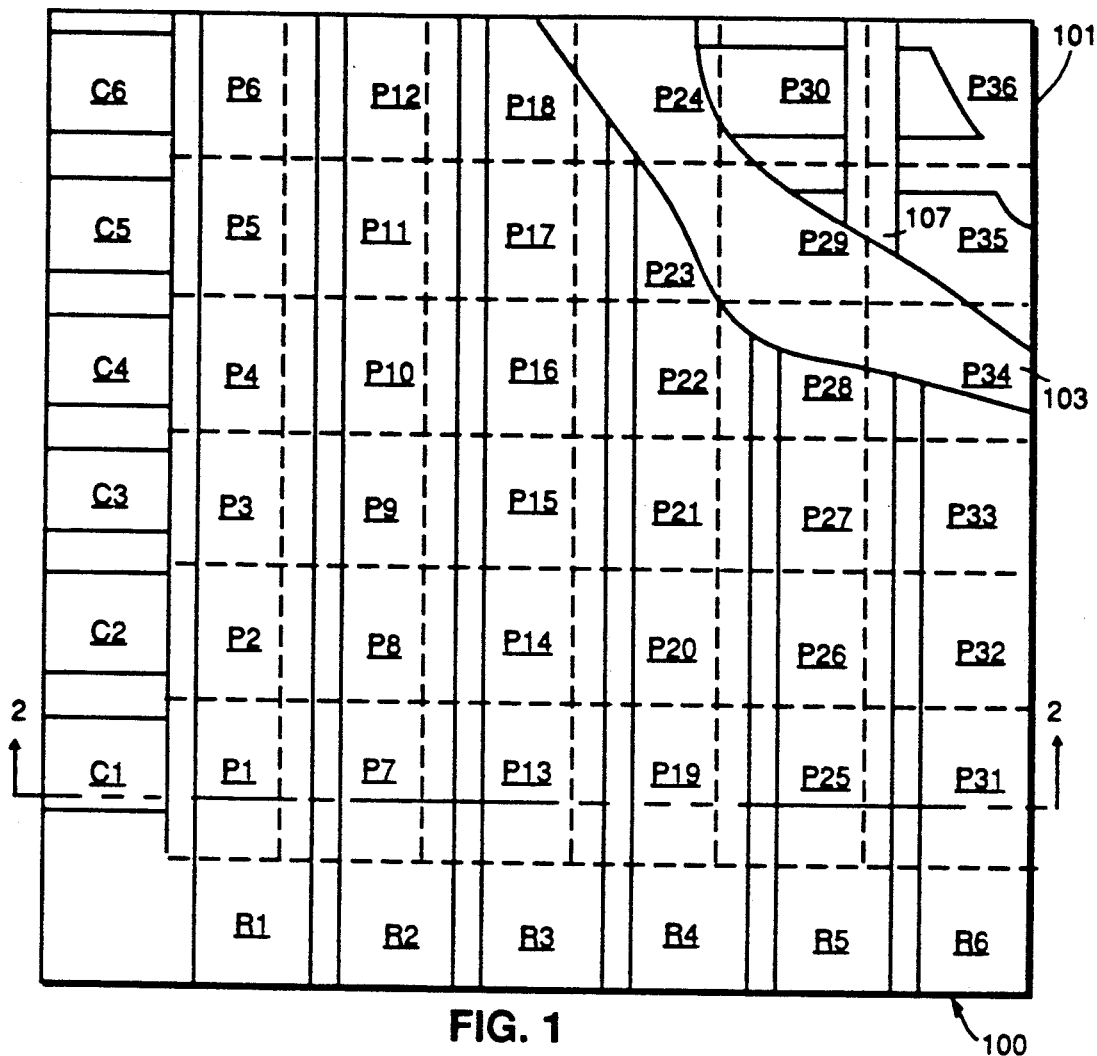
FIG. 1 is a plan view with portions broken away of an organic electroluminescent device capable of producing an image display.
Figure 2:
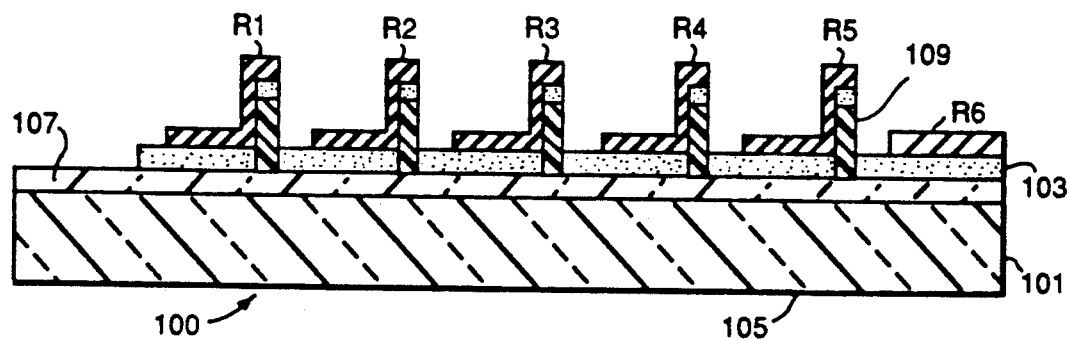
FIG. 2 is a sectional view taken along line 2—2 in FIG. 1.

Referring to FIGS. 1 and 2, an organic EL light emitting device 100 is shown having the capability of producing an image display. A light transmissive, preferably transparent, electrically insulative support 101 is shown bearing a series of light transmissive, preferably transparent, first electrode elements C1, C2, C3, C4, C5 and C6, arranged on the support in parallel, laterally spaced columns. In contact with and overlying all but the left most extremities of the first electrode elements is an organic EL medium 103. Overlying the organic EL medium is a series of second electrode elements R1, R2, R3, R4, R5 and R6, arranged in parallel, laterally spaced rows. The second electrode elements extend laterally beyond the lower (as shown in FIG. 1) edge of the EL medium onto the lower portion of the support.

Although conventional imaging displays can have very large numbers of electrodes in rows and columns, the 6 rows and 6 columns of electrodes shown are more than sufficient to illustrate the principles of device operation. With 6 rows and 6 columns of electrode elements the EL device can be made to emit light independently in any or all of the 36 separate areas, hereinafter referred to as pixels or imaging pixels. The pixels are shown in FIG. 1 as the areas P1 to P36 bounded entirely by dashed lines or dashed lines and one or two edges of the EL medium. The pixels together form an image display array.

In operation a selected pattern of light emission from the device is produced that can be seen by viewing the surface 105 of the support. In a preferred mode of operation the device is stimulated to emit by sequentially stimulating one row of pixels at a time and repeating the stimulating sequence at a rate chosen so that the interval between repeated stimulations of each row is less than the detection limit of the human eye, typically less than about 1/60th of a second. The viewer sees an image formed by emission from all stimulated rows, even though the device at any instant is emitting light from only one row.

To create the desired image pattern, the electrode elements C1 to C6 inclusive are independently biased to form a portion of the image pattern appropriate for pixels P1 to P6 inclusive sharing the common second electrode element R1. If, for example, emission from pixels P1, P2 and P3 is desired while emission from pixels P4, P5 and P6 is not, the potential of electrode elements C1, C2 and C3 are electrically biased relative to the electrode element R1 to stimulate emission while the electrode elements C4, C5 and C6 are either not biased to stimulate emission or are electrically biased against emission. Immediately following stimulation in the desired pattern from pixels P1 to P6 in the first row, a new pattern of stimulation is supplied to the electrode elements C1 to C6, and the electrode element R2 is next biased to stimulate the selected pattern of emission from the pixels P7 to P12 inclusive in the second row.

An important point to note is that for light emitted by the EL medium it must penetrate one of the first electrode elements. To be light transmissive the thickness of each first electrode element must be limited, which also increases its resistance. By choice of the column and row arrangement shown the first electrode elements are required to carry only the small current needed to stimulate one pixel. The second electrode elements, which are not required to be light transmissive and hence can be of greater thickness and lower resistance, are each capable of conducting all of the current required to stimulate all the pixels in any one row.

A significant advantage of the EL device 100 over comparable conventional devices capable of forming an image display is that no degradation of either the EL medium or second electrode elements is incurred in achieving the desired patterning of the second electrode elements into rows. The second electrode elements are deposited on the EL medium in their desired pattern rather than being uniformly deposited and then patterned, as taught by Scozzafava, cited above. It is not necessary that any processing materials (e.g., no liquid solutions) contact the EL medium or the materials forming the second electrode elements to achieve the desired electrode row pattern. This is made possible by providing the device with features that define the row pattern of the second electrode elements to be deposited before the EL medium is deposited.

The first step in forming the organic EL device 100 is to provide a light transmissive, preferably transparent, support with a light transmissive, preferably transparent, electrically conductive layer on its surface. The most common choice is a glass support coated with indium tin oxide. Photoresist patterning followed by etching of unprotected indium tin oxide areas with hydroiodic acid followed in turn by photoresist removal and rinsing provides the support with the first electrode elements C1 to C6. Instead of employing indium tin oxide, tin oxide or a similar electrically conductive transparent oxide, the first electrode elements can be formed of thin, light transmissive layers of any of the high (e.g., greater than 4.0 eV) work function metals.

Chromium and gold mixtures are particularly contemplated for forming the first electrode elements.

Since the support can be formed of any convenient light transmissive electrically insulative material and the first electrodes can be formed of relatively stable light transmissive metals and metal oxides, the support and first electrode elements together provide a deposition surface 107 that can withstand common chemical patterning techniques, such as photolithography, without chemical degradation.

The elements responsible for defining the desired row pattern of the second electrode elements to be deposited on the EL medium are walls 109. The walls can be formed on the deposition surface 107 by any convenient conventional patterning technique.

In a simple, specifically preferred technique the walls are formed by spin coating a negative working photoresist onto the deposition surface. The spin coating procedure can be repeated after drying to increase the thickness of the photoresist layer, if desired. Patterned exposure crosslinks the photoresist to an insoluble form in exposed areas while unexposed areas can be removed by development and washing techniques. Crosslinking by exposure produces strong, relatively rigid walls.

Numerous alternative wall forming techniques are possible. Instead of building up a thick photoresist layer by successive spin coating steps, thicker photoresist layers can be formed on the support by laminating a photoresist coating on a flexible support, such as transparent film, to the supporting surface. In this form the photoresist is typically a monomer that is polymerized by imagewise exposure following lamination. After imagewise exposure stripping the film also removes the monomer in areas that are not exposed.

In another wall forming technique the photoresist does not form the walls, but defines the wall pattern by its presence in areas surrounding the walls on the supporting surface. Photoresist layer formation can take any of the forms described above, but imagewise exposure is chosen to leave the photoresist in the areas surrounding the walls. Either a positive or negative working photoresist can be employed. Subsequently a wall forming material, such as silica, silicon nitride, alumina, etc., is deposited uniformly so that it overlies the photoresist where present and is deposited on the deposition surface in wall areas. After the walls are formed, the photoresist can be removed by any convenient conventional technique—e.g. solvent lift-off.

To allow the second electrode elements to be deposited in the desired row pattern the organic EL device is prepared with the walls positioned along common boundaries of the pixels in adjacent rows. The organic EL medium is next deposited by any convenient conventional vapor phase deposition technique over the walls and the remainder of the deposition surface. As shown in FIG. 1 the left and lower edge of the deposition surface is free of the organic EL medium so that the portions of the electrode elements extending into these areas are available for external electrical lead attachments. These laterally extended portions of the electrode elements are commonly referred to as bonding pads. A mask, such as a strip of tape, along the edges of the substrate adjacent bonding pad sites can be used to define the deposition pattern of the organic EL medium. Alternatively, the organic EL medium can deposited over the entire deposition surface and then mechanically removed by abrasion.

Generally any vapor phase deposition technique can be employed known to be useful in depositing one or more layers of an organic EL medium. It is generally preferred that the height of the walls be chosen to exceed the thickness of the organic EL medium. In efficient device constructions the organic EL medium, even when present in multilayer forms, has a thickness of less than 1 $\mu$m (10,000 Å) and typically less than half this thickness. Hence achieving useful wall heights is well within the capabilities of conventional patterning techniques useful for wall formation.

Following deposition of the organic EL medium, a source is provided for the metals used for deposition of the second electrode elements. For efficient organic EL devices the second electrode elements require a metal having a lower (less than 4.0 eV) work function to be in contact with the organic EL medium. One or more low work function metals alone or combination with one or more higher work function metals are deposited on the organic EL medium by any convenient directional (i.e., line of sight) transport technique. To insure linear transport from their source to the organic EL medium surface the metal atoms are preferably transported through a reduced pressure atmosphere. This increases the mean free path of the metal ions during transport from the source to the surface of organic EL medium, thereby minimizing scattering and maintaining deposition in a directionally controlled manner. Generally the pressure of the ambient atmosphere during deposition is reduced so that the spacing between the source and the surface of the organic EL medium is less than the mean free travel path of the metal atoms (that is, less than the distance a metal atom on average travels before colliding an atom in the ambient atmosphere). Conventional deposition techniques compatible with the directional transport requirements include vacuum vapor deposition, electron beam deposition, ion beam deposition, laser ablation and sputtering.

To achieve a deposition pattern of the second electrode elements in laterally spaced rows as shown in FIGS. 1 and 2 the deposition surface 107 is positioned in relation to the source of metal to be deposited so that each wall is interposed between the source and an adjacent portion of the surface of the organic EL medium. When deposition is undertaken in such an orientation the interposed portions of the walls intercept metal ions travelling from the source, thereby preventing metal deposition on the organic EL medium on one side of each wall. This provides the spacing between adjacent rows of second electrode elements. Preferred practical ranges of orientations in relation to the source of metal atoms are established when the direction of travel of the metal atoms (or the line of sight between the source) and the deposition surface forms an angle with the normal of the deposition surface (an axis normal to the deposition surface) of from about 10° to 60°, most preferably from about 15° to 45°.

Deposition of low (<4.0 eV) work function metal, alone or in combination of one or more higher work function metals, requires only that a continuous layer containing the low work function metal be deposited to achieve maximum efficiency of electron injection into the organic EL medium. However, since the second electrode elements are, as shown, responsible for carrying the current generated by all pixels in each row, it is preferred to increase the thickness of the second electrode element beyond the 200 to 500 Å thickness levels contemplated to provide a continuous layer. Although thick electrodes of up to 1 μm or even higher can be formed using the original metal composition, it is generally preferred to switch deposition after initial formation of continuous layers containing low work function metal so that only relatively higher work function (and hence less chemically reactive) metals are deposited. For example, an initial continuous layer of magnesium (a preferred low work function metal) and silver, indium or aluminum would preferably be increased in thickness for the purpose of reducing second electrode element resistance by depositing a convenient higher work function metal commonly used in circuit fabrication, such as gold, silver, copper and/or aluminum. The combination of a lower work function metal at the interface of the organic EL medium and a higher work function metal completing the thickness of the overlying second electrode elements is particularly advantageous, since the higher electron injection efficiencies produced by a lower work function metal are fully realized even though the lower work function metal is limited to the second electrode element interface with the organic EL medium while the presence of the higher work metal increases the stability of the second electrode elements. Hence, a combination of high injection efficiency and high electrode element stability is realized by this arrangement.

Figure 3:
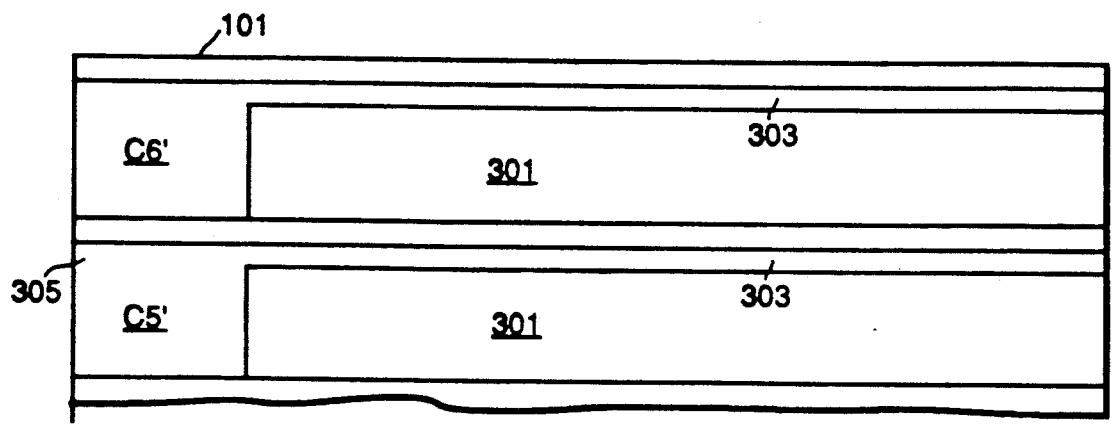
FIG. 3 is a plan view detail of an alterative construction satisfying the requirements of the invention.

In FIG. 3 an alternate construction of the first electrode elements is shown. The support 101 and all other device features, except as noted, are identical to those described above in connection with device 100. The requirement that the first electrode element be light transmissive limits the thickness of the electrode elements and thereby places an upper limit on its conductance. To increase the conductance of the first electrode elements without reducing their light transmission the first electrode elements C5' and C6' are each shown formed with a light transmissive portion 301 in edge contact with a current conduction strip 303, which can but need not be light transmissive. To increase the electrical conductance of the current conduction strips as compared to the light transmissive portions they are most conveniently formed by depositing a metal in the indicated areas over a first electrode element of the type previously described. The metal can be more conductive than the material forming the light transmissive portions of the first electrode elements. Since the current conduction strips are not required to be light transmissive, their conductance is preferably further increased by increasing their thickness as compared to the light transmissive portions of the first electrode elements. The current conduction strips each extend to and extend over the entire width of each first electrode element in each bonding pad area 305. This structural modification of the first electrode elements can be used to increase light emission, reduce internal resistance or both.

Figure 4:
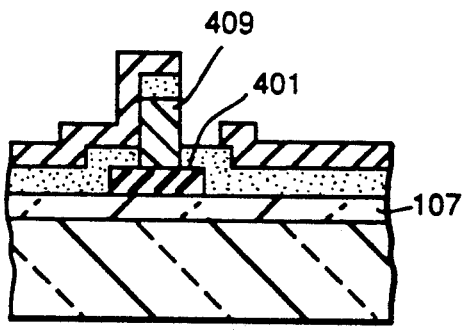
FIGS. 4 and 5 are sectional view details of alternative constructions satisfying the requirements of the invention.

In FIG. 4 a detail of an alternative image display organic EL device construction is shown that is identical to that of the devices previously described, except as specifically noted. The significant structural modification is that a thin electrically insulative strip (or pedestal) 401 is formed on the deposition surface 107 prior to forming each wall 409. Since the pedestal is insulative, the wall is out of electrical contact with the first electrode elements and can therefore be constructed of any convenient electrically conductive, semiconductive or insulative material. If the walls are formed of an electrical conductor, such as metal, they can assist the second electrode elements in current conduction. Note that at the upper corners of the walls there is increased likelihood of direct contact between each wall and the overlying second electrode element, since the high radius of curvature of the organic EL medium in this locations increases the probability of thinning or a discontinuity in these areas. In the areas landing pad areas, not shown, the organic EL medium is entirely absent, and the second electrode element and wall are in each occurrence in direct contact.

Since the probability of inadvertent organic EL medium thinning or discontinuity is increased in short radius of curvature areas, an important function of the insulative pedestal is to reduce the risk of inadvertent shorting of the first and second electrode elements in areas immediately adjacent the walls. The pedestal can take the form of any relatively thin insulative layer, such as a vapor deposited silica or organic insulative layer. The pedestal can be any convenient thickness, but is generally preferred to have a thickness less than that of the organic EL medium..

Figure 5:
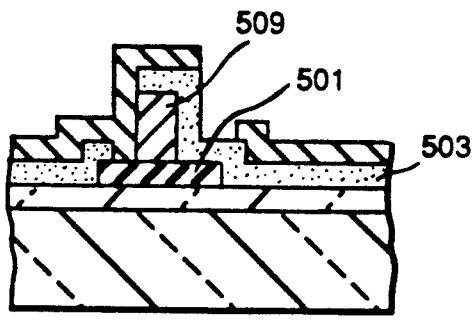

In FIG. 5 a detail of an alternative image display organic EL device construction is shown that is identical to that of the device of FIG. 4 previously described, except as specifically noted. In this embodiment the wall is electrically conductive. The organic EL medium 503 differs from organic EL medium 103 in that it is deposited with the deposition surface tilted with respect to the source or sources supplying material for deposition of the organic EL medium. Again, a portion of each wall is interposed between the source and the deposition surface, so that organic EL medium is not deposited on one lateral surface of each wall. The preferred angles and directional deposition considerations described above for deposition of the second electrode elements are here applicable to deposition of the organic EL medium. The organic EL medium is preferably directionally deposited by vacuum vapor deposition.

Following deposition of the organic EL medium 503 the second electrode elements are again deposited in the manner previously described. However, the orientation of the deposition surface to the metal source in forming the second electrode elements is chosen so that the second electrode elements are deposited on the side of each wall that is free of the organic EL medium. This places the second electrode elements in direct contact with the electrically conductive walls. Note that in this arrangement the electrically insulative pedestal is essential not only to keep the electrically conductive wall from shorting the first and electrode elements, but also to prevent the second electrode elements from directly contacting the first electrode elements in areas where the organic EL medium is absent.

One of the distinct advantages of the present invention is that the organic EL medium and the second electrode elements can be successively formed in the same vacuum chamber without intervening handling or exposure to ambient air and, specifically, the moisture contained in ambient air. Immediately following deposition of the second electrode elements, the device can be directly encapsulated or placed in a housing, so that the second electrode elements and organic EL medium receive only a very limited exposure to ambient air.

It is recognized that the organic EL medium and second electrode elements can be further protected from ambient prior to removal from the vacuum chamber in which they are deposited. For example, following formation of the second electrode elements an electrically insulative layer, such as silica, can be uniformly vapor deposited over the upper surfaces of the second electrode elements and organic EL medium before the resulting article is removed from the vacuum vapor deposition chamber.

Another alternative specifically contemplated for protecting the second electrode elements and underlying organic EL medium prior to removal from the vacuum chamber is to deposit a protective capping layer over the second electrode elements. In its simplest form the capping layer is simply a higher work function metal than the underlying second electrode element, as described above. When the capping layer is itself electrically conductive, it is deposited by the same techniques described above for forming the second electrode elements. Deposition onto the second electrode elements not only protects the second electrode elements, but also protects all active areas of the organic EL medium. Note that the only areas of the organic EL medium that are active in emitting light are those underlying the second electrode elements. The organic EL medium in areas separating adjacent second electrode elements is not an active emitter and, in any event, accounts for only a small fraction of total pixel array area. Nevertheless, if desired, a uniform insulative layer, such as silica, can deposited after the capping layers are deposited. Thus, when the image display array is removed from the vacuum chamber it can be sufficiently protected that immediate mounting in a sealed housing is not required to avoid degradation of device properties. All of the moisture sensitive portions of the device can be formed and protected during preparation within a single vacuum chamber and without intervening exposure to ambient air.

In the foregoing discussion the walls are schematically shown as orthogonal in section. Conventional wall formation techniques, such as photoresist patterns routinely employed in semiconductor fabrication, can achieve walls that essentially orthogonal in section as shown. It is, however, recognized that conventional patterning techniques are known and suitable for use in wall preparation that allow alternate sectional configurations of the walls. For example, the upper edges of the walls in many patterning procedures are somewhat rounded. Development and etching techniques are known that allow the walls to be undercut—that is, the base of the wall can be less than the thickness of the wall at or near its upper edge. Similarly, the sides of the walls can slope so that the base of the wall is of a greater width than at or near its upper edge. To accommodate the 60° range limit on orientation described above, it is preferred that the side walls form an angle of less than 60° (most preferably less than 45°) with the normal to the deposition surface.

The number and size of the individual pixels can be selected within conventional ranges to satisfy known imaging applications. Smaller edge length pixels require greater care in construction. Pixels having edge lengths in the range of from 400 to 20 $\mu$m on an edge are contemplated for fine detail imaging, for the overwhelming majority of imaging applications pixel edge lengths 100 $\mu$m or more on an edge are acceptable, and even in the more demanding image definition applications pixel edge lengths of 25 $\mu$m or more on an edge are common.

Photoresist layers of up to about 20 $\mu$m in thickness can be produced in a single spin coating step. By employing lamination or multiple spin coating techniques photoresist layer thicknesses of 200 $\mu$m or more can be readily attained. Because the thickness of the organic EL medium rarely exceeds 1 $\mu$m it is therefore apparent that attaining wall heights in excess of the thickness of the organic EL medium is readily achieved. In preparing pixels of edge lengths of 400 $\mu$m or less preferred wall heights are in the range of from about 0.5 to 10 $\mu$m are usually preferred for separating adjacent second electrode elements.

For pixels of relatively shorter edge lengths the ratio of wall height to width becomes important, as the walls in these applications account for a larger percentage of total pixel area. Ratios of wall height to width in the range of from 5:1 to 1:1 are readily achieved and generally preferred. It is contemplated that the active (i.e., the light emitting) portion of each imaging pixel will account for at least 25% and optimally at least 50% of its total area. For pixels larger than about 400 $\mu$m on an edge the width of the walls rarely accounts for a significant fraction of the total pixel area.

In the foregoing discussion exemplary materials for constructing the image display organic EL devices have in some instances been noted. From the description provided a wide variety of conventional materials useful for the practice of the invention is considered apparent, and no purpose would be served by a catalogue of known patterning and/or imaging materials, developers, etchants, supports, electrical conductors, electrical insulators, etc.

The materials of the image display organic EL devices of this invention can take any of the forms of conventional organic EL devices, such as those of Scozzafava, cited above; Tang U.S. Pat. No. 4,356,429; VanSlyke et al U.S. Pat. No. 4,539,507; VanSlyke et al U.S. Pat. No. 4,720,432; Tang et al U.S. Pat. No. 4,885,211; Tang et al U.S. Pat. No. 4,769,292; Perry et al U.S. Pat. No. 4,950,950; Littman et al U.S. Pat. No. 5,059,861; VanSlyke U.S. Pat. No. 5,047,687; Scozzafava et al U.S. Pat. No. 5,073,446; VanSlyke et al U.S. Pat. No. 5,059,862; VanSlyke et al U.S. Pat. No. 5,061,569; the disclosures of which are here incorporated by reference.

As will be apparent from these disclosures the organic EL medium is preferably constructed of a hole injecting and transporting zone, which is further preferably formed of a hole injecting layer adjacent the anode of the device and hole transporting layer, and an electron injecting and transporting zone, which is preferably constructed of an electron injecting layer adjacent the cathode of the device and an emitting layer in which hole and electron recombination occurs. The preferred device construction is for the first electrode elements to form the anode of the device and for the second electrode elements to form the cathode of device. The cathode can, if desired, be protected by additional layers not shown or discussed, but fully described in the above citations.

EXAMPLES

The invention can be further appreciated by reference to the following specific embodiments.

EXAMPLE 1

Fabrication of Walls on a Support

Walls were fabricated on a support by a photolithographic technique which employed the following steps:

1) Application of a negative-working photoresist onto a support

The support was a clean circular glass wafer 10.2 cm in diameter. The negative-working photoresist employed was of the following composition: 65 g of chlorobenzene as solvent, 1 g of ketocoumarin as sensitizer, 2 g of ethyl 4-dimethylaminobenzoate as activator, 20 g of dipenta-erythriotal monohydroxyl penta-acrylate (available commercially under the tradename SR-399 from Sartomer Co.), and 20 g of poly(methyl methacrylate) polymer (available commercially Elvacite 2021 TM from Du Pont). About 3 to 5 mL of the photoresist was deposited on the wafer, which was then set to spin at a low speed of 400 revolutions per second (RPM) for 5 seconds to spread the photoresist over the entire support surface. The spinning speed was then immediately ramped to 2000 RPM for 60 seconds. The wafer support with the spin-on photoresist coating was then dried in an air-convection oven for 60 seconds at 135° C.

2) Photoresist exposure of the photoresist

The photomask consisted of a chromium pattern on a 161.3 cm² square glass substrate. The chromium pattern had a set of parallel lines of various line widths and line pitches. The center to center line pitch is 100 $\mu$m and the line width was either 10 or 20 $\mu$m. The length of these lines was 5 cm. Photoresist exposure was performed on a mask aligner using a near UV light source.

3) Development of photoresist

The pattern exposed photoresist was developed using xylene as a solvent. This was done by spraying xylene on the support while it was spinning at 400 RPM for 40 seconds. The developed photoresist pattern was dried by spinning at 4000 RPM for 30 seconds followed by baking in a convection oven for 60 seconds.

The walls made of cross-linked photoresist and prepared by the above procedure had a height of 12 $\mu$m±1 $\mu$m. The width of the walls was either 10 or 20 $\mu$m with a center to center line pitch of 100 $\mu$m. The height of the walls was found to be readily modified by varying the rotation speed with which the photoresist was spin coated on the support or by varying the solid content of the photoresist formulation or both.

EXAMPLE 2

Generation of Metallic Electrodes Using Vertical Shadow Mask

The glass wafer with the photoresist patterns generated according to Example 1 was transferred to a vacuum deposition chamber. The wafer was placed at a distance of about 36 cm from a tungsten boat containing silver as the evaporant source. The orientation of the wafer was such that the angle between the surface normal of the wafer and the vertical line between the boat source and the center of the wafer was 35°. An aperture mask was placed in contact with the wafer to define the overall area where silver was to be deposited. Silver deposition was undertaken at a vacuum chamber pressure of about $1 \times 10^{-6}$ torr. The thickness of the silver film deposited on the wafer surface was about 2000 Å.

Conductive silver lines were created on the glass wafer between adjacent walls by the above vapor deposition method. Examined under an optical microscope, it was found that the parallel silver lines were separated from each other with clear gaps formed by interposition of the walls between the evaporant silver source and adjacent portions of the support. Electric measurement showed that these conductive parallel lines were completely isolated from each other. The electric resistance between any adjacent silver lines was greater than $1 \times 10^{12}$ ohms.

EXAMPLE 3

Walls on glass wafers were prepared by the method described in Examples 1 and 2, except that the height of the walls were varied by adjusting the spinning speed with which the photoresist was applied on the wafer. The thicknesses of the walls were 6.2 $\mu$m and 9.0 $\mu$m. Silver lines were deposited on these patterns with a deposition angle of 35° as described in Example 2. Resistance measurements indicated that the resistance between adjacent silver lines was greater than $1 \times 10^{12}$ ohms.

EXAMPLE 4

Instead of silver, Magnesium:silver alloy (10:1 elemental ratio) line patterns were generated as described in Examples 1 and 2. The wall height was 6 $\mu$m. The deposition angle was 20°. Optical examination indicated clear gaps between the Mg:Ag lines and resistance measurements showed complete electrical isolation of adjacent lines.

EXAMPLE 5

Walls of 2.4 $\mu$m were prepared according to Example 1. Mg:Ag alloy lines were deposited at a 30° angle. All of the Mg:Ag lines were fully electrically isolated. When the deposition angle was decreased to 0° (i.e., deposition was normal to the support surface), almost all the lines were electrically connected.

This example illustrates that electrical isolation between the metallic lines was readily achieved using a low profile wall and a small oblique angle of deposition. Without using an oblique angle of deposition electrical conduction between lines was observed.

EXAMPLE 6

Preparation of an Organic EL Medium Matrix

An indium tin oxide (ITO) coating (0.18 $\mu$m in thickness) on a 58 cm² square glass support was patterned to form a set of parallel lines with a line pitch of 380 $\mu$m and a line width of 280 $\mu$m. The length of these lines was 3.8 cm. Orthogonal to these ITO lines, parallel walls of 1.6 $\mu$m height were generated according to the method described in Example 1. The pitch between adjacent walls was 200 $\mu$m and the wall width was 20 $\mu$m.

An organic electroluminescent medium matrix was deposited on top of the glass support surface bearing the ITO lines and the photoresist walls. The organic EL medium matrix consisted of, in sequence, a copper phthalocyanine layer (200 Å), a 4,4'-bis[N-(1-naphthyl)-N-phenylamino]biphenyl layer (1400 Å) and an aluminum trisoxine layer (1000 angstroms). The layers were prepared by vacuum deposition. The deposition rate was between 2 to 5 Å per second for each of the three organic layers, and the deposition angle was 0° for each of these for each of the three organic layers. Upon the organic EL medium, Mg:Ag (10:1) alloy film was deposited through an aperture. The deposition angle was 45°. This deposition produced electrically isolated Mg:Ag lines on top of the organic EL medium matrix. Individual pixels were lit by applying a bias of about 10 to 15 volts between a selected ITO line and a selected Mg:Ag line.

The invention has been described in detail with particular reference to preferred embodiments thereof, but it will be understood that variations and modifications can be effected within the spirit and scope of the invention.

What is claimed is:

1. A light emitting device comprised of an image display array consisting of
 a plurality of light emitting pixels arranged in intersecting columns and rows,
 the pixels each being located on a common electrically insulative light transmissive support,
 the pixels in each column containing and being joined by a common light transmissive first electrode element located on the support,
 the first electrode element in each column being laterally spaced from an adjacent first electrode element on the support,
 an organic electroluminescent medium located on a supporting surface formed by the support and every first electrode element,
 the pixels of each row containing and being joined by a common second electrode element located on the organic electroluminescent medium, and
 the second electrode element in each row being laterally spaced from an adjacent second electrode element on the organic electroluminescent medium, characterized in that
 walls of a height exceeding the thickness of the organic electroluminescent medium are positioned on said supporting surface between adjacent rows of pixels, and
 the second electrode element in each row overlies the organic electroluminescent medium and extends from a location overlying one wall that bounds a row to a location laterally spaced from the second wall that bounds the row.

2. A light emitting device according to claim 1 further characterized in that the walls are electrically insulative and are located on the supporting surface.

3. A light emitting device according to claim 1 further characterized in that an electrically insulative layer underlies and extends laterally beyond each wall.

4. A light emitting device according to claim 3 further characterized in that the insulative layer extends on the supporting surface laterally from each wall to the next adjacent laterally spaced second electrode element.

5. A light emitting device according to claim 3 further characterized in that the walls are each in contact with an overlying portion of a second electrode element.

6. A light emitting device according to claim 1 further characterized in that each first electrode element includes a higher conductance edge portion.

7. A light emitting device comprised of an image display array consisting of
 a plurality of light emitting pixels arranged in intersecting columns and rows,
 the pixels each being located on a common electrically insulative light transmissive support,
 the pixels in each column containing and being joined by a common light transmissive anode located on the support,
 the anode in each column being laterally spaced on the support,
 the support and every anode together forming a supporting surface,
 laterally spaced walls having a height of greater than 1 $\mu$m located on the supporting surface, each wall overlying each anode, the walls being located between adjacent rows of pixels,
 an organic electroluminescent medium having a thickness of less than 1 $\mu$m located on the supporting surface and overlying the walls,
 the pixels of each row containing and being joined by a common cathode located on the organic electroluminescent medium, and
 the cathode in each row, extending from a location overlying one wall to a location laterally spaced from the second wall that bounds the row.

* * * * *